(12) United States Patent
Wang et al.

(10) Patent No.: US 7,966,090 B2
(45) Date of Patent: Jun. 21, 2011

(54) AUTOMATED MATERIAL HANDLING SYSTEM AND METHOD

(75) Inventors: Ming Wang, Zhonghe (TW); Nain-Sung Lee, Shin Chu (TW); Chia-Chin Hsu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 127 days.

(21) Appl. No.: 11/724,242

(22) Filed: Mar. 15, 2007

(65) Prior Publication Data

US 2008/0228310 A1    Sep. 18, 2008

(51) Int. Cl.
*G06F 19/00* (2011.01)

(52) U.S. Cl. ........ 700/112; 700/110; 700/113; 700/228; 198/349

(58) Field of Classification Search ............ 700/99–103, 700/112–115, 121, 214, 228–230; 414/626, 414/217, 331, 522; 705/7, 13; 198/349, 198/358

See application file for complete search history.

(56) References Cited

U.S. PATENT DOCUMENTS

| | | | |
|---|---|---|---|
| 6,351,686 B1 * | 2/2002 | Iwasaki et al. | 700/228 |
| 6,468,021 B1 * | 10/2002 | Bonora et al. | 414/522 |
| 6,516,238 B1 * | 2/2003 | Kim et al. | 700/112 |
| 6,622,057 B1 * | 9/2003 | Ko et al. | 700/113 |
| 6,728,588 B2 * | 4/2004 | Cho et al. | 700/110 |
| 6,772,032 B2 * | 8/2004 | Iwasaki et al. | 700/113 |
| 6,845,294 B2 * | 1/2005 | Jevtic et al. | 700/228 |
| 6,996,448 B2 * | 2/2006 | Huang et al. | 700/112 |
| 7,047,095 B2 * | 5/2006 | Tomoyasu | 700/108 |
| 7,328,079 B2 * | 2/2008 | Tseng et al. | 700/112 |
| 7,413,069 B2 * | 8/2008 | Brill et al. | 198/358 |
| 2005/0191162 A1 * | 9/2005 | Chang et al. | 414/626 |
| 2005/0245101 A1 | 11/2005 | Brill et al. | |
| 2007/0244594 A1 * | 10/2007 | Chik et al. | 700/112 |
| 2008/0035449 A1 * | 2/2008 | Lee | 198/349 |

OTHER PUBLICATIONS

Agrawal, G.K.; Heragu, S.S.; , "A survey of automated material handling systems in 300-mm SemiconductorFabs," Semiconductor Manufacturing, IEEE Transactions on, Feb. 2006, vol. 19, No. 1, pp. 112-120.*

Arzt, T.and F. Bulcke. 1999. A New Low Cost Approach in 200 mm and 300 mm AMHS. Semiconductor Fabtech, 10: 19-26.*

Nazzal, D., and L. F. McGinnis. Queuing models of vehicle-based Automated Material Handling Systems in semiconductor fabs. In Proceedings of the 2005 Winter Simulation Conference, 2464-2471.*

(Continued)

*Primary Examiner* — Albert Decady
*Assistant Examiner* — Dave Robertson
(74) *Attorney, Agent, or Firm* — Finnegan, Henderson, Farabow, Garrett & Dunner, LLP (57) ABSTRACT

An automated material handling system (AMHS) includes a plurality of first stockers for material storage and a plurality of second stockers for material storage, wherein the second stockers are smaller than the first stockers. A method of operating an AMHS, wherein the AMHS includes a plurality of first stockers for material storage and a plurality of second stockers for material storage and the second stockers are smaller than the first stockers, includes selecting one of the first stockers and the second stockers after a step of a process is performed with one or more pieces of material at a piece of processing equipment; unloading the one or more pieces of material from the piece of processing equipment; and transporting the one or more pieces of material to the selected one of the first stockers and the second stockers.

21 Claims, 5 Drawing Sheets

OTHER PUBLICATIONS

Kuo C-H (2002) Modeling and performance evaluation of an overhead hoist transport system in a 300 mm fabrication plant. Int J Adv Manuf Technol 14:153-161.*

Brain, M.; Gould, R.; Kaempf, U.; Wehrung, B.; , "Emerging needs for continuous flow FOUP transport," Electronics Manufacturing Technology Symposium, 1999. Twenty-Fourth IEEE/CPMT , vol., No., pp. 76-82, 1999.*

J.T. Lin, F.K. Wang, Y.M. Chang, A hybrid push/pull-dispatching rule for a photobay in a 300 mm wafer fab, Robotics and Computer-Integrated Manufacturing, vol. 22, Issue 1, Feb. 2006, pp. 47-55.*

* cited by examiner

AUTOMATED MATERIAL HANDLING SYSTEM AND METHOD

FIELD OF THE INVENTION

This invention relates in general to an automated material handling system (AMHS) and, more particularly, to an AMHS with two types of stockers having different sizes for improving an efficiency of handling semiconductor wafers.

BACKGROUND OF THE INVENTION

Figure 1:
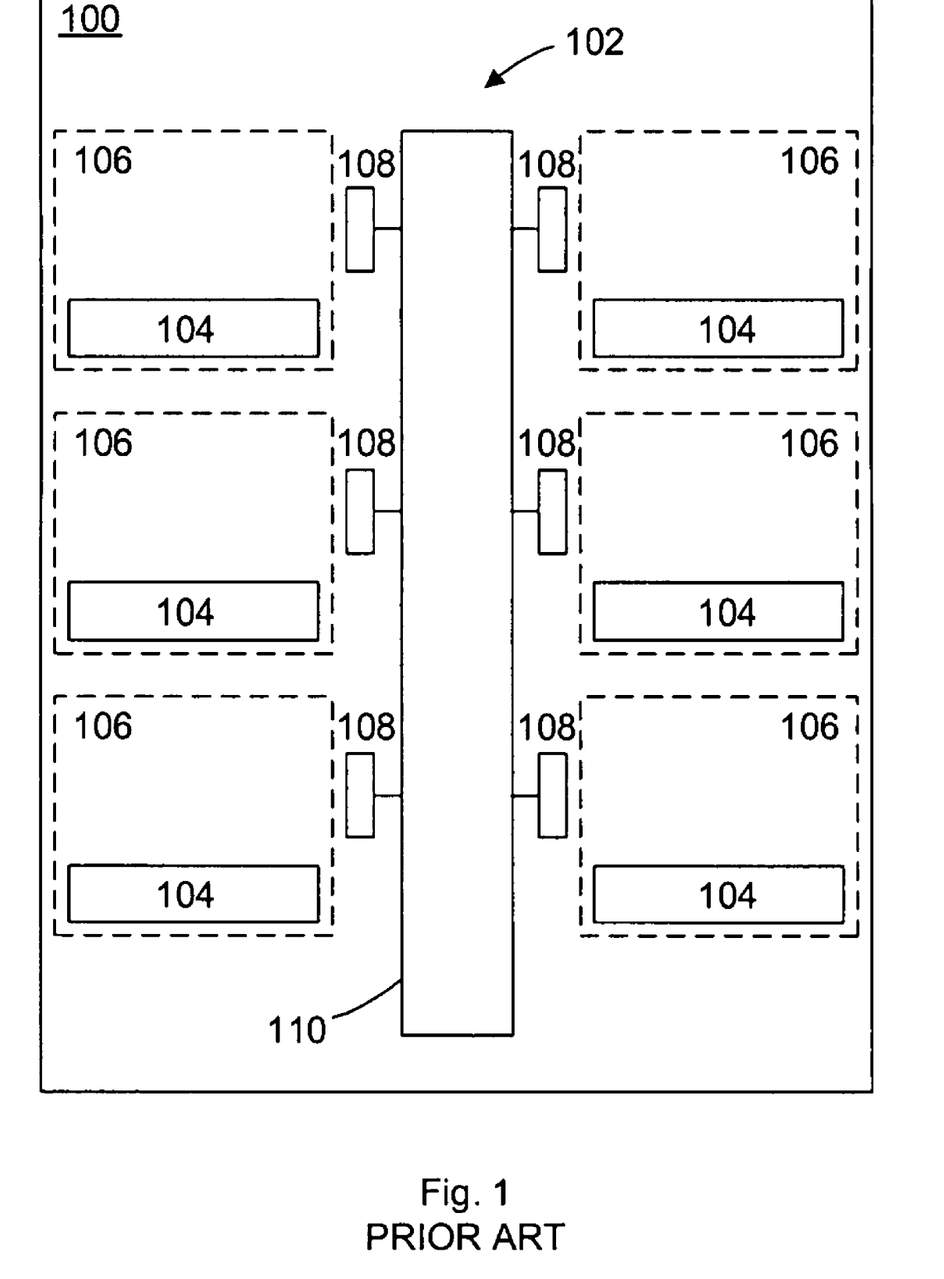
FIG. 1 shows a conventional wafer fabrication facility.

During fabrication of semiconductor integrated circuits, semiconductor wafers are subjected to multiple processing steps at different processing equipment. Fabrication facilities generally include automated material handling systems (AMHS) for transporting the wafers between the processing equipment. FIG. 1 shows a conventional wafer fabrication facility 100 including an AMHS 102.

Referring to FIG. 1, in wafer fabrication facility 100, equipment 104 with similar functions is generally clustered in areas 106, which are called process bays or bays. AMHS 102 includes stockers 108 respectively located at one end of process bays 106 and an inter-bay automated transport rail loop provided as an overhead hoist transport (OHT) 110 located between stockers 108. Each of stockers 108 contains a number of vertically-stacked storage bins for storing semiconductor wafers. OHT 110 has a carrier (not shown) for carrying semiconductor wafers. OHT 110 runs in a loop, picks up wafers from stockers 108, and drops off wafers at stockers 108.

Wafers being processed are at the respective equipment 104. When a process is completed on a wafer, an operator or a technician unloads the wafer from equipment 104 of one of bays 106 and sends the wafer to a nearby first one of stockers 108. OHT 110 picks up the wafer from the first one of stockers 108 and transports it to a second one of stockers 108 next to another one of bays 106 where the next process step is to be performed. The wafer stays in the second one of stockers 108 while waiting for the next processing step. Then, an operator or a technician from the second one of stockers 108 picks up the wafer and loads the wafer into the corresponding equipment 104. Once all required processing on a wafer is complete, the wafer is transported by OHT 110 to a destination such as a test facility or a packaging facility. Wafers are contained in containers such as a standard mechanical interface (SMIF) or a front opening unified pod (FOUP). Each time a container is transferred from one place to another, a barcode on the container is scanned and the transfer of the wafers contained therein is recorded in a computer system for operating AMHS 102.

Thus, between two processing steps, wafers are unloaded from a piece of equipment 104, picked up by an operator or a technician, loaded into one of stockers 108, unloaded from that stocker 108, picked up by OHT 110, transported to a next one of stockers 108, loaded into that next stocker 108, unloaded from that next stocker 108, picked up by an operator or a technician, and loaded into a next piece of equipment 104. Because stockers 108 are generally voluminous, the loading and unloading of wafers are time consuming. For example, each loading of a wafer into one of stockers 108 or unloading of a wafer from stocker 108 may take 3-4 minutes. Also, fabrication facilities are expansive, and each process bay 106 may be, for example, 50 meters long. Walking with wafer containers, especially containers of large size wafers such as 12" wafers, from a piece of equipment 104 in one of bays 106 to the stocker 108 at the end of that bay 106 may also take several minutes. Consequently, the need to access stockers 108 at the respective ends of process bays 106 between processing steps is a bottleneck that constrains any attempt to improve an efficiency in manufacturing semiconductor integrated circuits.

SUMMARY OF THE INVENTION

Consistent with embodiments of the present invention, an automated material handling system (AMHS) includes a plurality of first stockers for material storage and a plurality of second stockers for material storage, wherein the second stockers are smaller than the first stockers.

Consistent with embodiments of the present invention, there is provided a method of operating an AMHS, wherein the AMHS includes a plurality of first stockers for material storage and a plurality of second stockers for material storage, and the second stockers are smaller than the first stockers. The method includes selecting one of the first stockers and the second stockers after a step of a process is performed with one or more pieces of material at a piece of processing equipment; unloading the one or more pieces of material from the piece of processing equipment; and transporting the one or more pieces of material to the selected one of the first stockers and the second stockers.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention.

In the drawings.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 2:
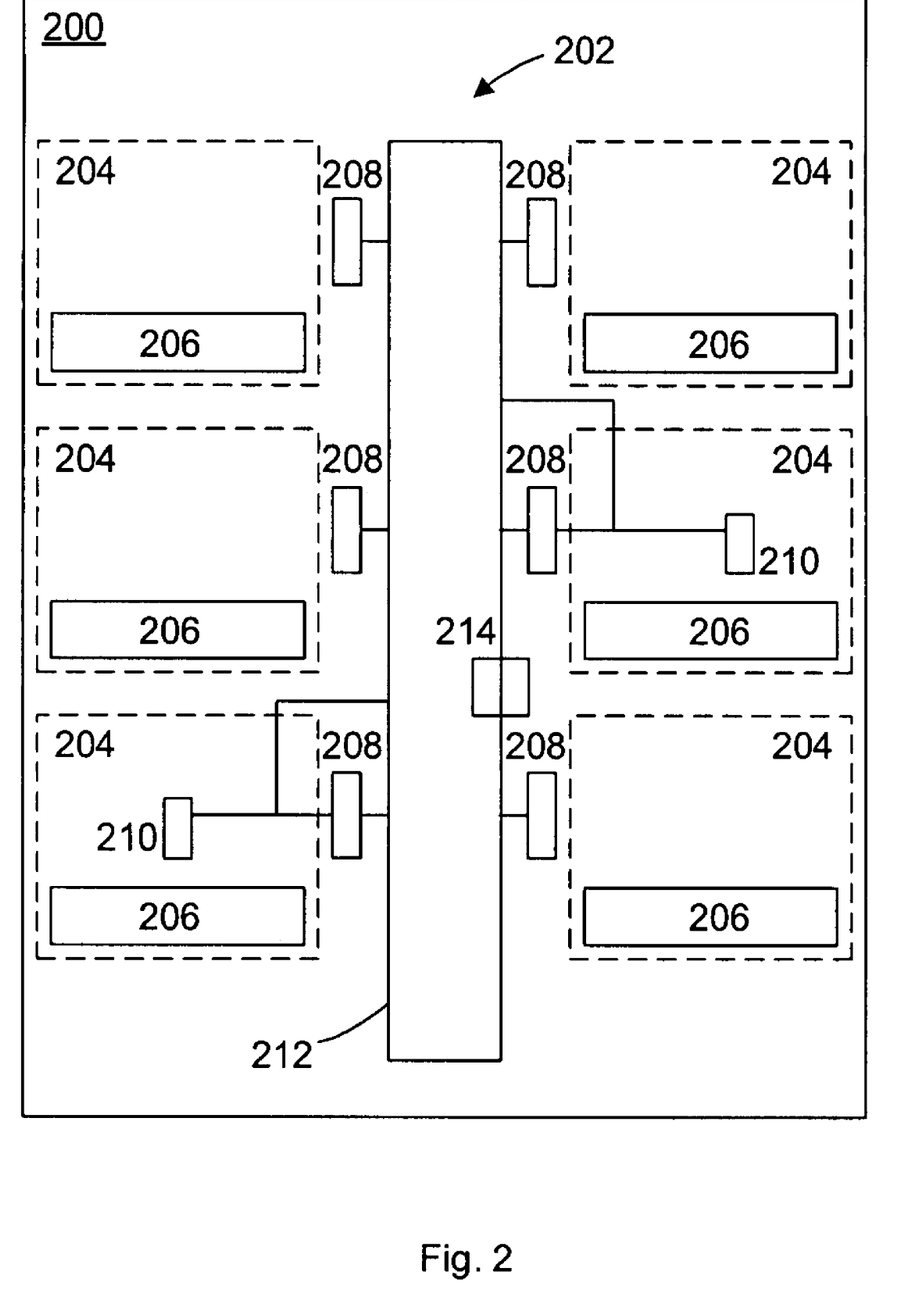
FIG. 2 shows a wafer fabrication facility including an automated material handling system (AMHS) consistent with embodiments of the present invention.

Consistent with embodiments of the present invention, fabrication facilities may use automated material handling systems (AMHS) including two types of stockers having different sizes. Larger stockers are normally only installed in areas at the end of process bays, such as stockers 108 shown in FIG. 1, because of their bulky size. However, consistent with the invention, smaller stockers may be installed in other places of convenience. Smaller stockers are faster to access because of their smaller storage capacities. FIG. 2 shows a wafer fabrication facility 200 including an AMHS 202 consistent with embodiments of the present invention.

Referring to FIG. 2, wafer fabrication facility 200 includes process bays or bays 204 that each include an area where processing equipment 206 is clustered and wafers are processed. AMHS 202 includes first stockers 208 and second stockers 210. First stockers 208 are located respectively at one end of bays 204, while second stockers 210 may be located within bays 204. AMHS 202 also includes an OHT 212 that connects to first stockers 208 and second stockers 210 for picking up and transporting wafers. One or more overhead hoist buffers (OHB) 214 may be attached to OHT 212 for temporarily storing wafers. For example, wafers may be temporarily stored in OHB 214 when the wafers are transported between equipment within the same bay 204 and do not need to be loaded into stockers 208 or 210, or when the wafers are already unloaded from stockers 208 or 210 but have to wait for processing equipment 206 to complete processing of other wafers currently being processed.

Consistent with embodiments of the present invention, second stockers 210 are smaller in size and also have smaller capacities for storing semiconductor wafers than first stockers 208. For example, first stockers 208 may be 10 meters long, 1.5 meters wide, and 6 meters high. In contrast, as an example, second stockers 210 may be 0.5 meters long, 0.5 meters wide, and 0.9 meters high. Because second stockers 208 store fewer semiconductor wafers, shelving a wafer or finding a wafer among those stored in second stockers 208 takes less time as compared to first stockers 210. In other words, an access time of second stockers 210 is less than that of first stockers 208. Also, first stockers 208 cannot be installed in any place where there is a need for wafer storage, because first stockers 208 are bulky. In contrast, second stockers 210 are smaller and may be installed in locations where first stockers 208 cannot be installed, such as an area next to equipment within bays 204, as shown in FIG. 2.

Figure 3:
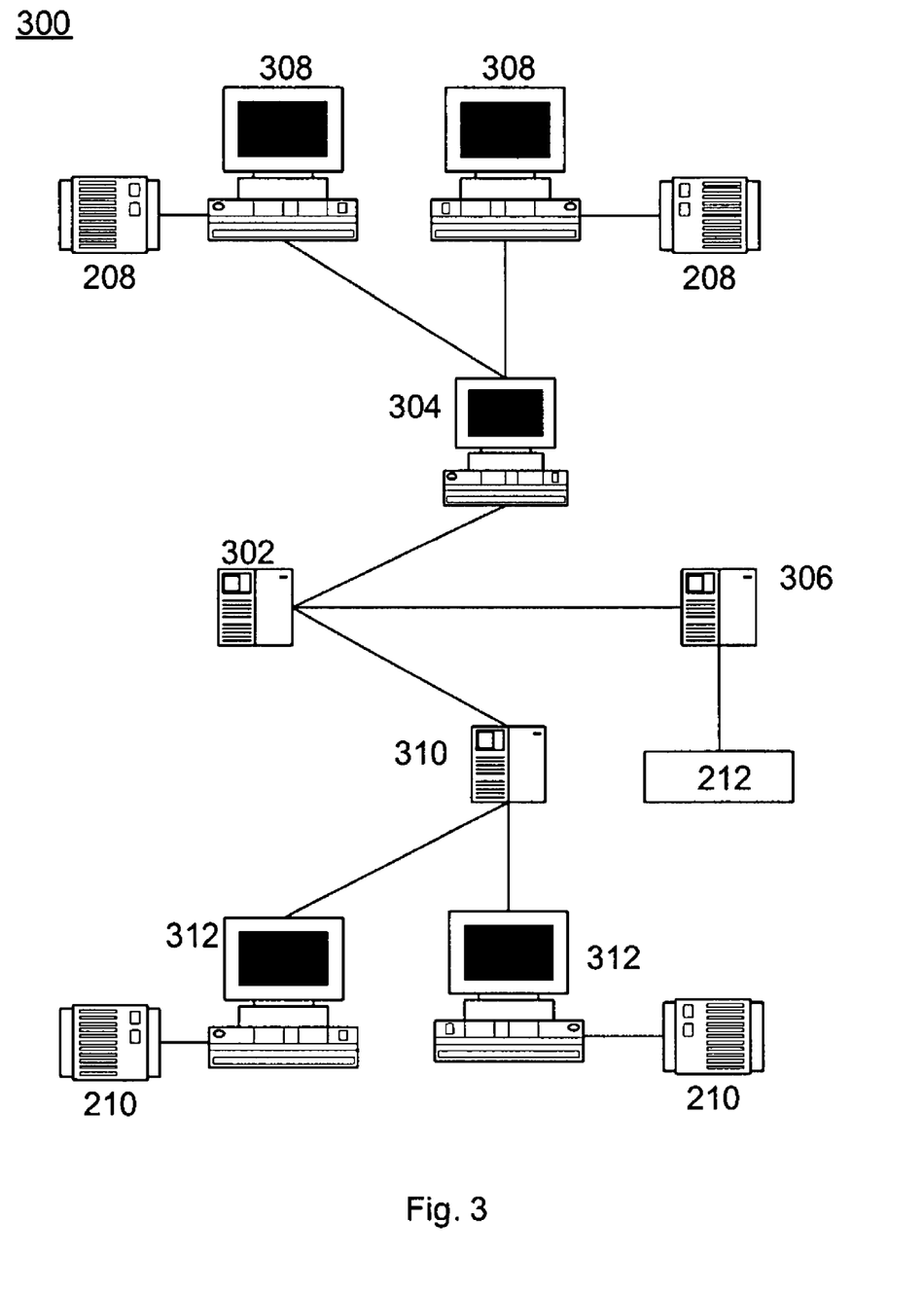
FIG. 3 shows a computer system for operating the AMHS shown in FIG. 2.

AMHS 202 includes a computer system (not shown in FIG. 2) for automating operations thereof. FIG. 3 illustrates an exemplary configuration of a computer system 300 for operating AMHS 202. Referring to FIG. 3, a maintenance engineering system (MES) server 302 operates AMHS 202. A computer 304 connected to MES server 302 coordinates the operations between first stockers 208 and other parts of AMHS 202. A material control system (MCS) server 306 connected to MES server 302 operates OHT 212. Each of first stockers 208 also includes a computer 308 connected to computer 304 for controlling loading, unloading, and shelving wafers in the corresponding one of first stockers 208. Computer system 300 also includes a fast stocker server 310 connected to MES server 302 for coordinating the operations between second stockers 210 and other parts of AMHS 202. Each of second stockers 210 is controlled by a computer 312 running a fast stocker driver program. Computers 312 communicate with fast stocker server 310, which further communicates with MES server 302, for arranging the transportation of wafers into and out of second stockers 210.

Wafers may be processed individually or in batches. For convenience of illustration, a single wafer is referred to in the following descriptions. It is to be understood that when wafers are processed in batches, each batch of wafers follows the same processing steps and may be transported in the same manner as a single wafer as described below.

When a piece of equipment completes a step of a process on a wafer, computer system 300 determines whether the wafer should be sent to one of first stockers 208 or one of second stockers 210. For example, if a nearby first stocker 208 is full, the wafer is sent to a nearby second stocker 210; if the next step of the process will be performed on the wafer immediately, the wafer may be sent to the nearby second stocker 210, which directly transfers the wafer to its destination, thereby avoiding time-consuming access of first stockers 208. Otherwise, if the next step of the process is not performed immediately, the wafer is sent to the nearby first stocker 208, picked up by OHT 212, sent to the first stocker 208 adjacent one of bays 204 where a piece of equipment to perform the next processing step is located, and then sent to the appropriate piece of equipment to perform the next processing step. If the process is completed on the wafer, the wafer may be sent to the nearby first stocker 208 and then sent to a test facility or a packaging facility. After the determination by computer system 300, an operator or a technician picks up the wafer from the piece of equipment, walks to the corresponding one of first stockers 208 or second stockers 210, and loads the wafer into the corresponding one of first stockers 208 or second stockers 210

Figure 4:
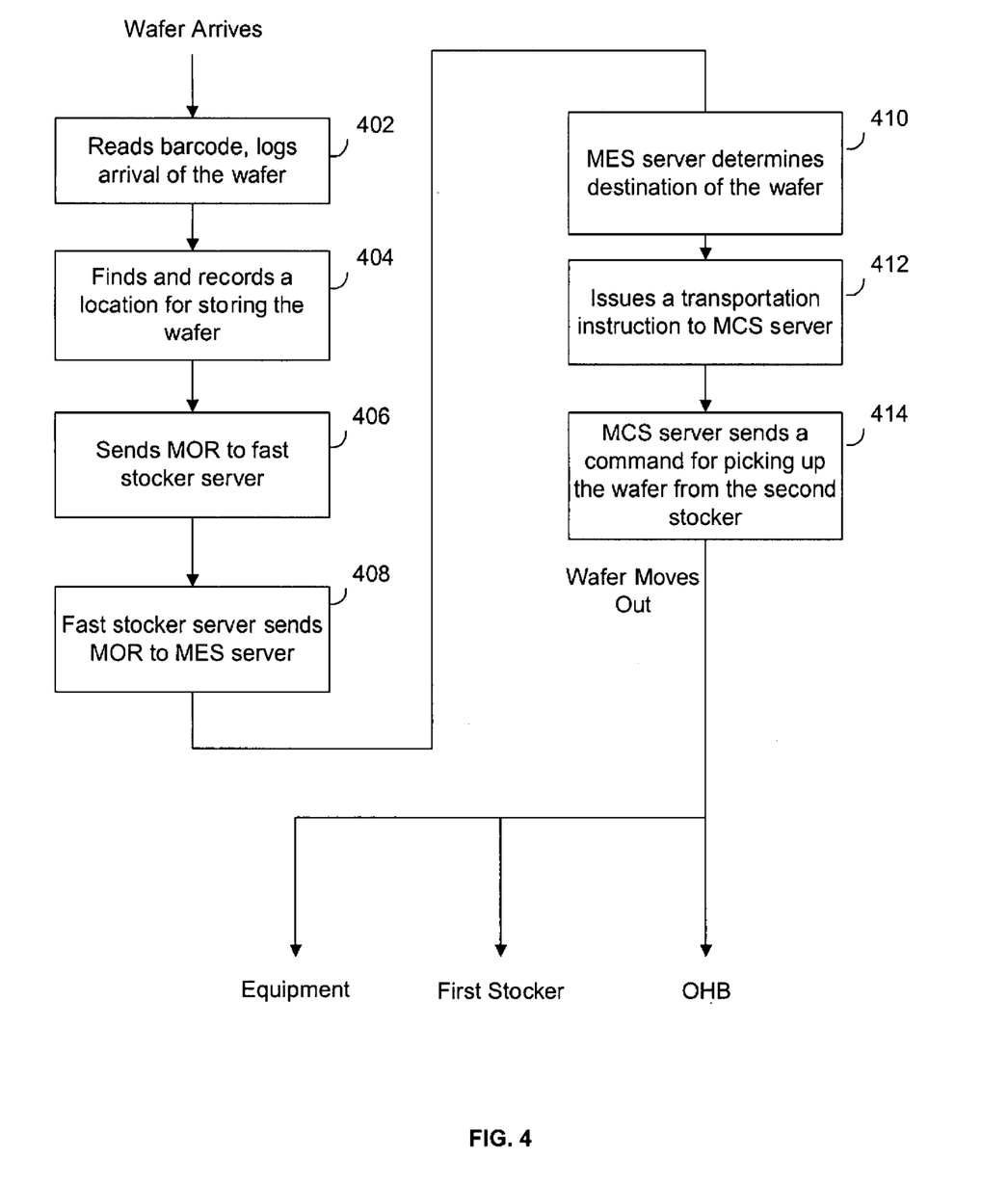
FIG. 4 illustrates a method of material handling by the AMHS shown in FIG. 2.

FIG. 4 is a flow chart illustrating a process by which computer system 300 handles a wafer after the wafer is sent to one of second stockers 210. When the wafer arrives at a nearby second stocker 210, the fast stocker driver program running on the one of computers 312 associated with that nearby second stocker 210 identifies the wafer by reading a bar code on a container such as an SMIF or a FOUP containing the wafer, and logs the arrival of the wafer. (Step 402.) Then, the fast stocker driver program determines and records a location for the wafer within second stocker 210, and shelves the wafer. (Step 404.) The fast stocker driver program then sends a move-out request (MOR) to fast stocker server 310. (Step 406.) Fast stocker server 310 sends an MOR to MES server 302 (Step 408), which determines where the wafer should be sent (Step 410). Alternatively, the fast stocker driver program may determine the destination of the wafer. After the destination of the wafer is determined, MES server 302 then sends a transportation instruction to MCS server 306. (Step 412.) In accordance with the transportation instruction, MCS server 306 sends a command to OHT 212 to pick up the wafer from the corresponding one of second stockers 210. (Step 414.) The wafer may be directly sent to a piece of equipment to perform a next processing step if the equipment is free, or sent to OHB 214 if the equipment is currently busy, or sent to one of first stockers 208 if no more processing is needed soon or if the wafer should be sent out of wafer fabrication facility 200.

For convenience, only the operations for transferring wafers into and out of second stockers 210 are discussed above. The operations for transferring wafers into and out of first stockers 208 are similar to those of second stockers 210 and are not described herein.

Consistent with embodiments of the present invention, between two processing steps, semiconductor wafers can often be sent from one piece of equipment to another through second stockers 210, which are faster to access than first stockers 208. Also, second stockers 210 are smaller than first stockers 208 and can be installed in areas not suitable for first stockers 208. Therefore, a walking distance for operators of the equipment is much shorter than what would otherwise be, such as that in fabrication facility 100 shown in FIG. 1. Consequently, an AMHS consistent with embodiments of the present invention eliminates the above-noted bottleneck by improving an efficiency of the fabrication facility by eliminating the need to access bulky stockers of fabrication facility 100 between processing steps and by obviating the need for a long walking distance from equipment to the stockers, as illustrated in FIG. 1.

In the above, descriptions were made of handling semiconductor wafers by AMHS 202. It is to be understood, however, that AMHS 202 can handle not only semiconductor wafers, but also other materials such as masks or reticles used in lithographical processes.

Second stockers 210 may be installed at different locations depending on several factors. For example, second stockers 210 may be installed at a distance from nearby ones of first stockers 208, selected to provide greater convenience to equipment operators or technicians. Second stockers 210 may also be installed next to some of first stockers 208 that are overly utilized to relieve a burden on those first stockers 208. A utilization rate of first stockers 208 may be defined by, e.g., an average number of accesses per unit time. First stockers 208 may be considered overly utilized when the utilization rate thereof is over a threshold value.

Figure 5:
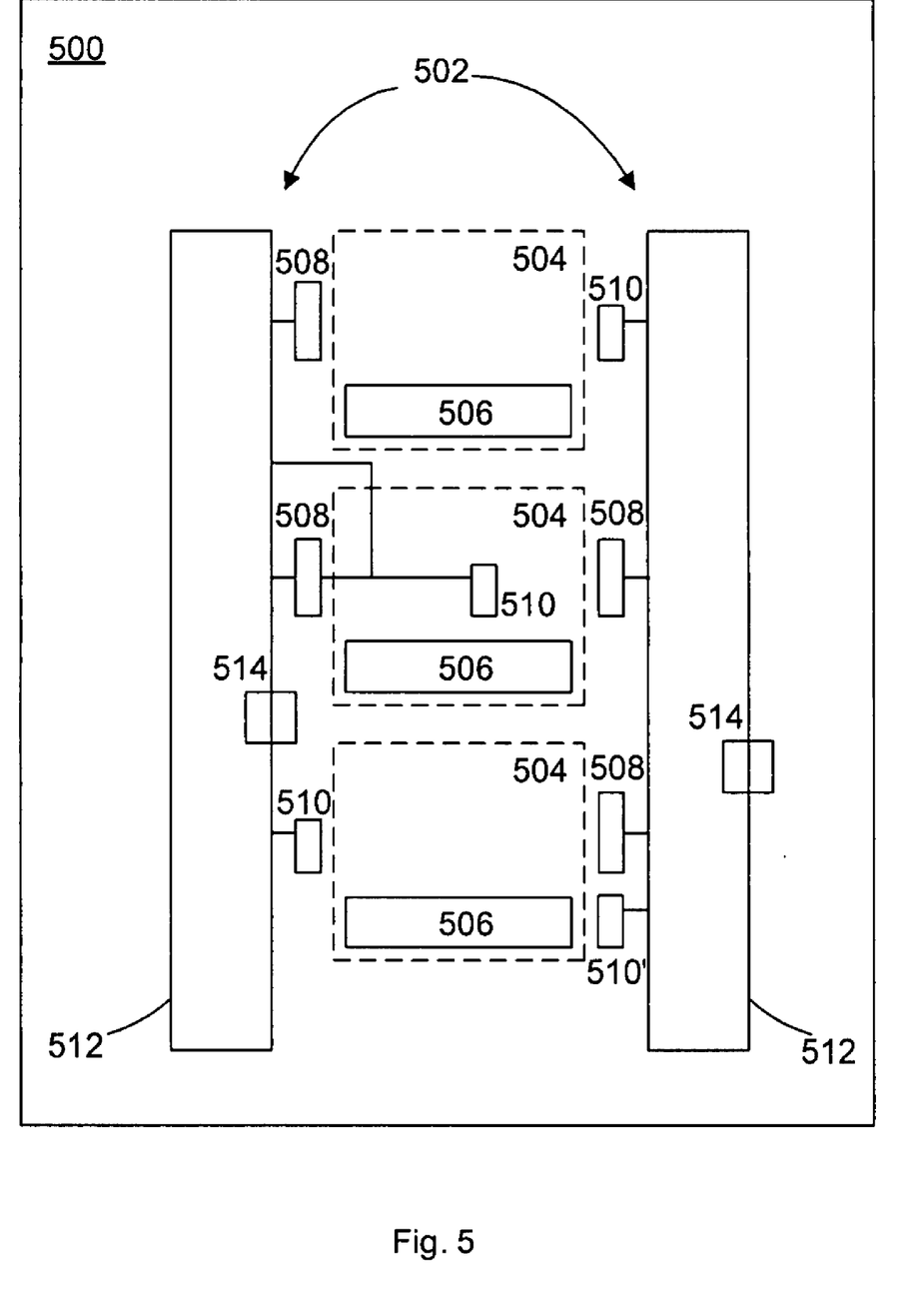
FIG. 5 shows a wafer fabrication facility including an AMHS also consistent with embodiments of the present invention.

Furthermore, second stockers 210 may be installed at the ends of the processing bays 204 where first stockers 208 are not installed. FIG. 5 shows an exemplary fabrication facility 500 with an AMHS 502 consistent with embodiments of the present invention. Referring to FIG. 5, wafer fabrication facility 500 includes process bays or bays 504 where equipment 506 is clustered and wafers are processed. AMHS 502 includes first stockers 508, second stockers 510, and two OHTs 512 installed on both sides of bays 504. First stockers 508 are larger in size and also have larger storage capacity than second stockers 510. First stockers 508 are located at the ends of bays 504. However, first stockers 508 are not installed on each end of every one of bays 504, due to, e.g., cost and time constraints. Rather, as shown in FIG. 5, some of second stockers 510 are installed on ends of bays 504 where first stockers 508 are not installed. FIG. 5 also shows one of second stockers 510, labeled as 510', installed next to one of first stockers 508 that is overly utilized, to relieve a burden on that first stocker 508. Others of second stockers 510 are installed within bays 504. FIG. 5 also shows that AMHS 502 includes OHBs 514 attached to OHTs 512 for temporary wafer storage.

Second stockers 510 are smaller, less expensive, and faster to access than first stockers 508. Therefore, AMHS 502 consistent with embodiments of the present invention not only improves an efficiency of material handling, but also provides a cost efficient solution for wafer fabrication facilities that do not require very high capacities for wafer storage.

FIG. 2 shows that first stockers 208 are outside bays 204, and FIG. 5 shows that first stockers 508 are outside bays 504. It is to be understood, however, that the process bays may be considered to include an area where first stockers 208 or first stockers 508 are located. In other words, first stockers 208 may be within or outside bays 204, and first stockers 508 may be within or outside bays 504.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An automated material handling system (AMHS) in a wafer fabrication facility, the wafer fabrication facility including a plurality of bays each including a cluster of processing equipment, the AMHS comprising:
   an overhead hoist transport located outside the plurality of bays;
   a plurality of first stockers for material storage, the first stockers being directly coupled to the overhead hoist transport;
   a plurality of second stockers for material storage, the second stockers being smaller than the first stockers and being directly coupled to the overhead hoist transport;
   an overhead hoist buffer outside the plurality of bays to provide temporary material storage for material waiting to be transferred to a piece of processing equipment without being transferred to the first or second stockers.

2. The AMHS of claim 1, wherein the plurality of first stockers are respectively located at first ends of the plurality of bays.

3. The AMHS of claim 1, wherein the plurality of second stockers are respectively located within selected ones of the bays.

4. The AMHS of claim 1, wherein the first stockers are located at first ends of ones of the bays, and ones of the second stockers are located respectively at the first ends of others of the bays.

5. The AMHS of claim 1, wherein one or more of the second stockers are respectively located next to one or more of the first stockers, wherein a utilization rate of the one or more of the first stockers is greater than a threshold value.

6. The AMHS of claim 1, wherein the overhead hoist transport is located on a side of the plurality of bays.

7. The AMHS of claim 1, further comprising two of the overhead hoist transports on two sides of the plurality of bays.

8. The AMHS of claim 1, wherein the first and second stockers store one or more of semiconductor wafers, masks, and reticles.

9. The AMHS of claim 1, further comprising a computer system for operating the AMHS.

10. The AMHS of claim 9, wherein the computer system comprises a maintenance engineering system (MES) server, a first computer coupled to the MES server for coordinating operations of the plurality of first stockers, a material control system (MCS) server coupled to the MES server for operating an overhead hoist transport, and a fast stocker server coupled to the MES server for coordinating operations of the plurality of second stockers.

11. The AMHS of claim 10, wherein the computer system further comprises a plurality of second computers, each of the plurality of second computers for operating one of the plurality of first stockers.

12. The AMHS of claim 10, wherein the computer system further comprises a plurality of second computers, each of the plurality of second computers for operating one of the plurality of second stockers.

13. A method of operating an automated material handling system (AMHS) in a wafer fabrication facility, the wafer fabrication facility including a plurality of bays each including a cluster of processing equipment, the AMHS including an overhead hoist transport located outside the plurality of bays, a plurality of first stockers for material storage and directly coupled to the overhead hoist transport, a plurality of second stockers for material storage and directly coupled to the overhead hoist transport, and an overhead hoist buffer outside the plurality of bays to provide temporary material storage for material waiting to be transferred to a piece of processing equipment without being transferred to the first or second stockers, wherein the second stockers are smaller than the first stockers, the method comprising:

selecting one of the first stockers and the second stockers after a step of a process is performed with one or more pieces of material at a piece of processing equipment;

unloading the one or more pieces of material from the piece of processing equipment;

transporting the one or more pieces of material to the selected one of the first stockers and the second stockers;

transporting another one or more pieces of material directly from one of the second stockers to the overhead hoist transport; and transporting the one or more pieces of material from the selected one of the first stockers and the second stockers to the overhead hoist buffer when another piece of processing equipment to perform a next step of the process is busy.

14. The method of claim 13, wherein selecting one of the first stockers and the second stockers comprises selecting one of the second stockers that is nearby the piece of processing equipment when one of the first stockers nearby the piece of equipment is full.

15. The method of claim 13, wherein selecting one of the first stockers and the second stockers comprises selecting one of the second stockers that is nearby the piece of equipment when another process is to be performed on the one or more pieces of material immediately.

16. The method of claim 13, wherein selecting one of the first stockers and the second stockers comprises selecting one of the first stockers that is nearby the piece of equipment when the process is completed on the one or more pieces of material.

17. The method of claim 13, wherein selecting one of the first stockers and the second stockers comprises selecting one of the first stockers that is nearby the piece of equipment when a next step of the process is not to be performed immediately.

18. The method of claim 13, wherein selecting one of the first stockers and the second stockers comprises selecting one of the second stockers that is nearby the piece of equipment, the method further comprising transporting the one or more pieces of material from the one of the second stockers to another piece of processing equipment to perform a next step of the process.

19. The method of claim 13, wherein selecting one of the first stockers and the second stockers comprises selecting one of the second stockers that is nearby the piece of equipment, the method further comprising transporting the one or more pieces of material from the one of the second stockers to one of the first stockers.

20. The method of claim 13, wherein the one or more pieces of material comprise semiconductor wafers.

21. The method of claim 13, wherein the one or more pieces of material comprise masks or reticles.

* * * * *